(12) United States Patent
Liu et al.

(10) Patent No.: US 10,566,526 B1
(45) Date of Patent: Feb. 18, 2020

(54) PATTERNING OF A MAGNETORESISTANCE STRUCTURE INCLUDING TWO HARD MASKS

(71) Applicant: Allegro MicroSystems, LLC, Manchester, NH (US)

(72) Inventors: Yen Ting Liu, Hsinchu (TW); Maxim Klebanov, Manchester, NH (US); Paolo Campiglio, Arcueil (FR); Sundar Chetlur, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/122,019

(22) Filed: Sep. 5, 2018

(51) Int. Cl.
  *H01L 43/08* (2006.01)
  *H01L 43/12* (2006.01)
  *H01L 43/10* (2006.01)

(52) U.S. Cl.
  CPC .............. *H01L 43/12* (2013.01); *H01L 43/08* (2013.01); *H01L 43/10* (2013.01)

(58) Field of Classification Search
  CPC .......... H01L 43/12; H01L 43/08; H01L 27/22
  See application file for complete search history.

(56) References Cited

U.S. PATENT DOCUMENTS

| 7,001,783 | B2 | 2/2006 | Costrini et al. |
| 8,747,680 | B1 | 6/2014 | Deshpande et al. |
| 10,050,193 | B1 | 8/2018 | Klebanov et al. |
| 10,396,279 | B2 * | 8/2019 | Deshpande ............. H01L 43/02 |
| 2004/0012056 | A1 | 1/2004 | Nejad et al. |
| 2011/0008915 | A1 | 1/2011 | Nozieres et al. |

(Continued)

OTHER PUBLICATIONS

Brazzle et al., "Solution Hardened Platinum Alloy Flexure Materials for Improved Performance and Reliability of MEMS Devices;" Journal of Micromechanics and Microengineering, vol. 15, No. 1; Oct. 1, 2004; pp. 43-48; 6 Pages.

(Continued)

*Primary Examiner* — Mark V Prenty
(74) *Attorney, Agent, or Firm* — Daly, Crowley, Mofford & Durkee, LLP

(57) ABSTRACT

A method includes depositing on a substrate a magnetoresistance stack, depositing a first hard mask on the magnetoresistance stack, depositing a first photoresist on the first hard mask, patterning the first photoresist to expose portions of the first hard mask, and etching the exposed portions of the first hard mask to expose a portion of the magnetoresistance stack. The method further includes stripping the first photoresist, etching the exposed portions of the magnetoresistance stack and the first hard mask to form a first intermediate structure having a base and a pillar structure, depositing an etch barrier on the first intermediate structure, and depositing a second hard mask on the etch barrier. A second photoresist is deposited on the second hard mask. The method further includes patterning the second photoresist to expose portions of the second hard mask, etching the exposed portions of the second hard mask, stripping the second photoresist, etching a portion of the second hard mask, a portion of the etch barrier and the base to form a second intermediate structure, and depositing a capping barrier on the second intermediate structure.

13 Claims, 7 Drawing Sheets

(56) References Cited

U.S. PATENT DOCUMENTS

2013/0032908 A1    2/2013   Tang et al.
2014/0332914 A1   11/2014   Liou et al.
2017/0371007 A1   12/2017   Anderson et al.
2018/0033955 A1    2/2018   Wong et al.

OTHER PUBLICATIONS

MicroChem, "LOR and PMGI Resists;" Data Sheet Rev. A; Retrieved from http://microchem.com/pdf/PMGI-Resists-data-sheetV-rhcedit-100311.pdf; Jul. 28, 2014; 8 Pages.

MicroChem, "PMGI & LOR Lift-off Resists;" Product Description; Retrieved from http://www.microchem.com/Prod-PMGI_LOR.htm; Feb. 14, 2012;2 Page.

Non-Final Office Action dated Mar. 24, 2017 from U.S. Appl. No. 15/219,694; 17 Pages.

Non-Final Office Action dated Jul. 14, 2017 for U.S. Appl. No. 15/195,124; 7 Pages.

Response to Office Action dated Mar. 24, 2017 for U.S. Appl. No. 15/219,694, filed Jun. 22, 2017; 12 Pages.

Response to Restriction Requirement dated Apr. 21, 2017 for U.S. Appl. No. 15/195,124, filed May 18, 2017; 1 Page.

Restriction Requirement dated Apr. 21, 2017 for U.S. Appl. No. 15/195,124; 5 Pages.

Taylor et al., "A High Fill Factor Linear Mirror Array for a Wavelength Selective Switch;" Journal of Micromechanics and Microengineering, vol. 14, No. 1; Oct. 14, 2003; pp. 147-152; 6 Pages.

\* cited by examiner

PATTERNING OF A MAGNETORESISTANCE STRUCTURE INCLUDING TWO HARD MASKS

BACKGROUND

A magnetic field sensing element is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. There are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

SUMMARY

A method includes depositing on a substrate a magnetoresistance stack comprising a plurality of layers comprising a first set of one or more magnetoresistance layers and a second set of one or more magnetoresistance layers, depositing a first hard mask on the magnetoresistance stack, depositing a first photoresist on the first hard mask, patterning the first photoresist using photolithography to expose portions of the first hard mask, and etching the exposed portions of the first hard mask to expose a portion of the magnetoresistance stack. The method further includes stripping the first photoresist, etching the exposed portions of the magnetoresistance stack and the first hard mask to form a first intermediate structure having a base and a pillar structure, depositing an etch barrier on the first intermediate structure, and depositing a second hard mask on the etch barrier. A second photoresist is deposited on the second hard mask. The method further includes patterning the second photoresist using photolithography to expose portions of the second hard mask, etching the exposed portions of the second hard mask, stripping the second photoresist, etching a portion of the second hard mask, a portion of the etch barrier and the base to form a second intermediate structure, and depositing a capping barrier on the second intermediate structure.

Features may include one or more of the following individually or in combination. The etching of the exposed portions of the magnetoresistance stack and the first hard mask to form the first intermediate structure having the base and the pillar structure may comprise etching the exposed portions of the magnetoresistance stack to form the first intermediate structure having the base, the base comprising a conductive layer on the substrate and an active element on the conductive layer. Etching the exposed portions of the magnetoresistance stack and the first hard mask to form the first intermediate structure having the base and the pillar structure may comprise etching the exposed portions of the magnetoresistance stack and the first hard mask to form the first intermediate structure having the pillar structure, the pillar structure comprising the first hard mask, capping material, an active element, and a tunneling barrier. Depositing on the substrate the magnetoresistance stack may comprise depositing one of a tunneling magnetoresistance (TMR) stack or a magnetic tunnel junction (MTJ) stack. Depositing the capping barrier may comprise depositing a capping barrier comprising silicon nitride. Depositing the magnetoresistance stack on the substrate may comprise depositing a magnetoresistance stack comprising a layer of magnesium oxide. Depositing the magnetoresistance stack on the substrate may comprise depositing a magnetoresistance stack comprising a layer of silicon nitride. Depositing the magnetoresistance stack on the substrate may comprise depositing the magnetoresistance stack on the substrate, the substrate comprising one of silicon dioxide or silicon nitride. Depositing the first hard mask or the second hard mask may comprise depositing silicon dioxide. Depositing an etch barrier comprises depositing an etch barrier comprising silicon nitride. Etching the exposed portions of the magnetoresistance stack may comprise etching using an ion beam etching process. Etching the portion of the second hard mask, the portion of the etch barrier and the portion of the base may comprise etching using an ion beam etching process. Depositing on the substrate a magnetoresistance stack having a plurality of layers comprising the first set of one or more magnetoresistance layers and the second set of one or more magnetoresistance layers may comprise depositing on the substrate a magnetoresistance stack having the plurality of layers comprising a first set of one or more magnetoresistance layers comprising one or more active elements and a tunneling barrier layer and a second set of one or more magnetoresistance layers comprising an active element.

Also described is a magnetoresistance structure comprising a base comprising a conductive layer on the substrate and an active element on the conductive layer, a pillar structure connected to the base, the pillar structure comprising a first hard mask, a capping material, an active element, and a tunnel layer, an etching barrier deposited on the pillar and the base, a second hard mask deposited on the etching barrier, and a capping barrier deposited on the second hard mask and covering side walls of the base.

Features may include one or more of the following individually or in combination. The base and the pillar structure may form one of a tunneling magnetoresistance (TMR) stack or a magnetic tunnel junction (MTJ) stack. The capping barrier may comprise silicon nitride. The tunnel layer may comprise a layer of magnesium oxide. The capping material may comprise a layer of silicon nitride. The magnetoresistance structure may further comprise a substrate connected to the conductive layer of the base, wherein the substrate comprises one of silicon dioxide or silicon nitride. The first or second hard mask may comprise silicon dioxide.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to pattern a magnetoresistance structure that includes two hard masks. In particular, the techniques described herein are used to form bottom contacts for a magnetoresistance structures such as for example, a GMR, a TMR (such as an MTJ for example) or hybrid of a GMR and a TMR. In one example, the techniques described herein improve flatness of an interface between a bottom interconnect and a TMR stack, which in turn improves a magnetic response of MR sensor element.

Figure 1B:
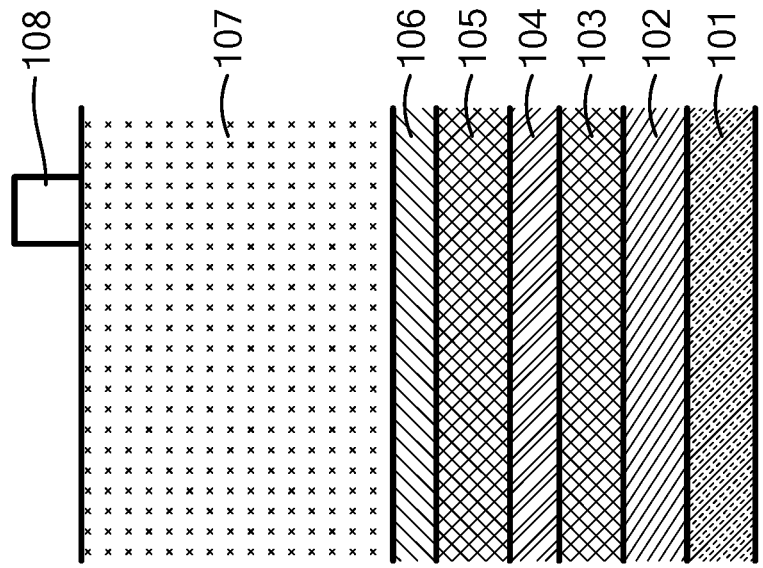
FIGS. 1A to 1L are diagrams of one example to pattern a magnetoresistance stack that includes two hard masks.
Figure 1A:
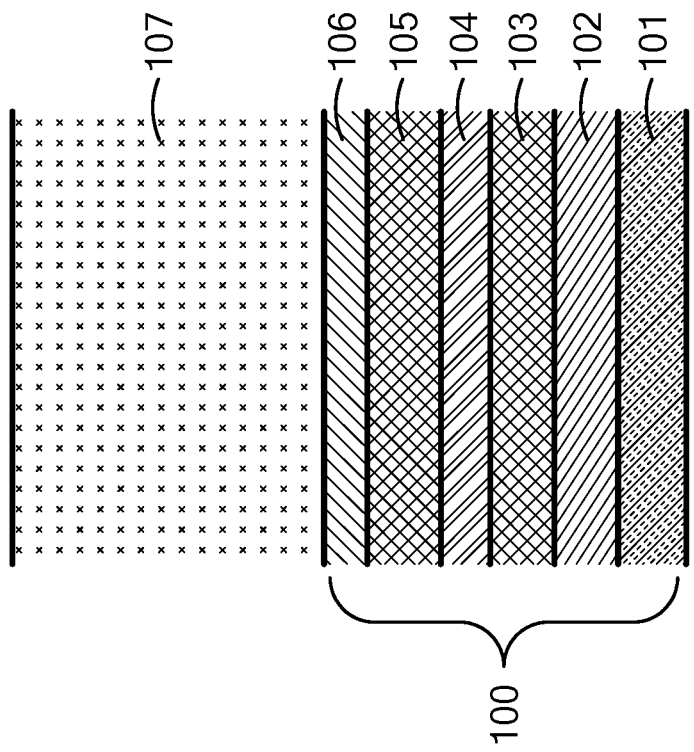

Referring to FIG. 1A, a multi-layer magnetoresistance stack is deposited on a substrate, and a hard mask is deposited on the magnetoresistance stack. For example, a magnetoresistance stack 100 that includes layers, 102, 103, 104, 105 is deposited on a substrate 101, an etch stop 106 is deposited on the layers 102-105, and a hard mask 107 is deposited on the etch stop layer. In one example, the magnetoresistance stack 100 may be used in a magnetic field sensing element. In one example, the magnetoresistance stack 100 is a tunneling magnetoresistance (TMR) stack, such as a magnetic tunnel junction (MTJ) stack for example.

In some embodiments, the substrate 101 does not have to support electronic circuitry, but may be, for example, a dummy substrate that only supports a magnetoresistance element. In one example, the substrate 101 may include any material suitable for supporting electronic circuitry. In some embodiments, the substrate 101 may include a semiconductor material, including but not limited to silicon, germanium, gallium arsenide, and/or other types of semiconductor materials. In other embodiments, the substrate 101 may include diamond, glass, ceramic, polymer and/or other materials. In one particular example, the substrate 101 is silicon dioxide or silicon nitride. In other examples, the substrate 101 may include both semiconductor and non-semiconductor materials.

In one example, the layer 102 is a bottom contact material that includes a conductor material (e.g., titanium nitride).

In one example, one or more of the layers 103, 104, 105, 106 may include two or more sublayers. In one example, the layers 103, 104, 105 may include active elements. In some examples, the layer 104 is a tunneling barrier, and in one particular example, the tunneling barrier includes magnesium oxide or aluminum oxide.

In some examples, the layer 106 is a capping material that includes, for example, silicon nitride or silicon dioxide. In one example, the hard mask 107 includes silicon dioxide or silicon nitride.

Referring to FIG. 1B, photoresist is deposited on a hard mask and photolithography is used to pattern the photoresist. For example, a photoresist 108 is deposited on the hard mask 107 and photolithography is used to pattern the photoresist 108 to expose portions of the hard mask 106.

Figure 1D:
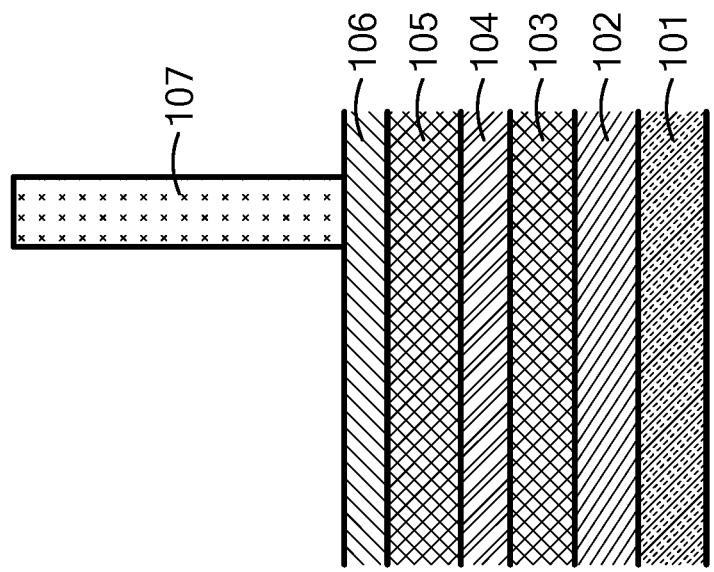
Figure 1C:
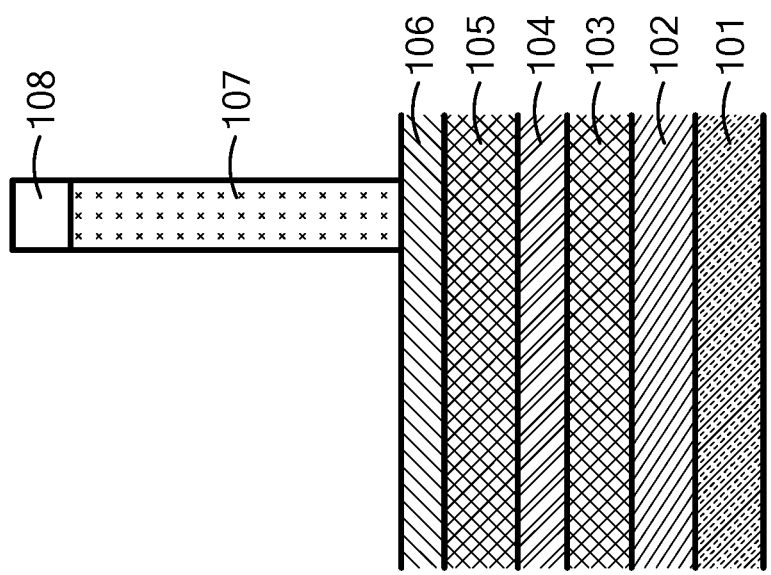

Referring to FIGS. 1C and 1D, an etching process is used to etch the exposed portions of the hard mask, and the photoresist is removed. For example, an etching process (e.g., reactive ion etching) is used to etch the hard mask 107 with the photoresist 108 acting as a mask, and after the etching of the hard mask 107, the photoresist 108 is stripped away.

Figure 1F:
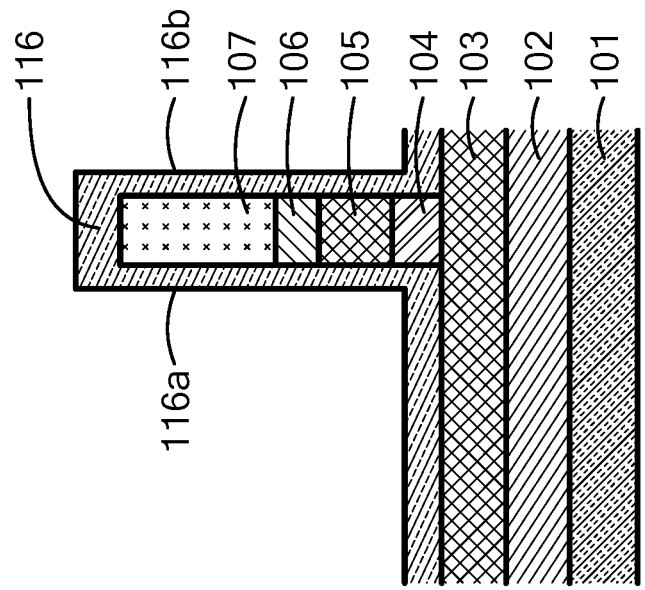
Figure 1E:
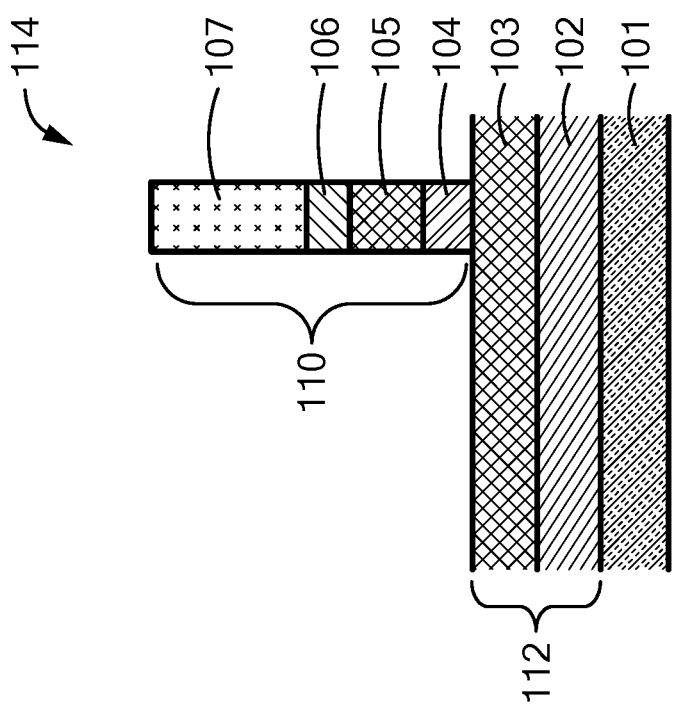

Referring to FIG. 1E, the magnetoresistance stack and the hard mask are etched. For example, the exposed portions of the magnetoresistance stack 100 and the hard mask 107 are etched using an ion beam etching process. In one particular example, not all of the layers 102, 103, 104, 105 and 106 of the magnetoresistance stack 100 are etched. For example, the layers 102, 103 are not etched, but the layers 104, 105, 106 are etched to form an intermediate structure 114 with the hard mask 107. For example, the remaining portions of layers 103, 104, 105, 106, 107 form a pillar structure 110 of the intermediate structure 114 and the layers 102, 103 form a base 112 of the intermediate structure 114. In one particular example, the tools used during ion beam etching determines that the layer 103 is an etch stop barrier and therefore should not be etched.

Referring to FIG. 1F, an etch barrier is deposited on the intermediate structure 114. For example, an etch barrier 116 is deposited on the remaining magnetoresistance stack completely covering the sides of the pillar structure 110 and is deposited on the base 112. The etch barrier 116 includes nonconductive material. In some examples, the etch barrier 116 includes silicon nitride or silicon dioxide. The etch barrier 116 includes nonconductive sidewalls 116a, 116b. The sidewalls 116a, 116b protect the layer 104 (e.g., tunneling barrier) from being shunted, for example, by any conductive material that may be re-deposited.

Figure 1H:
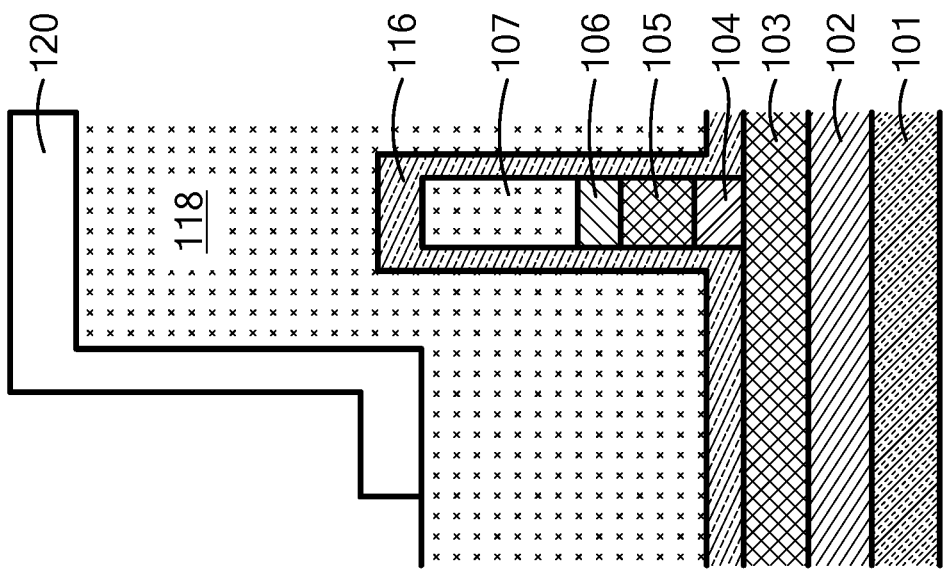
Figure 1G:
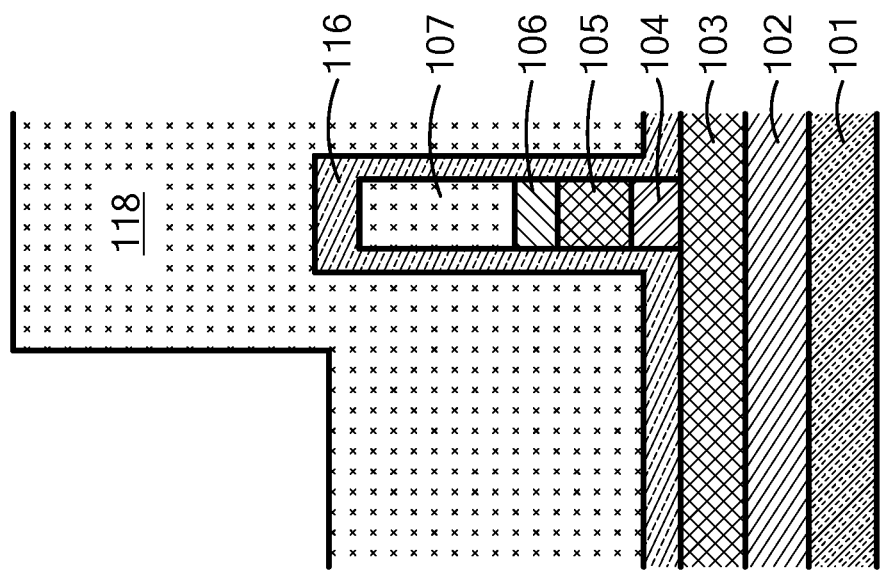

Referring to FIG. 1G, a second hard mask is deposited on the etch barrier 116. For example, a second hard mask 118 is deposited on the etch barrier 116. Referring to FIG. 1H, a second photoresist is deposited on the second hard mask and photolithography is used to pattern the second photoresist. For example, a second photoresist 120 is deposited on the second hard mask 118 and photolithography is used to pattern the second photoresist 120 to expose portions of the second hard mask 118.

Figure 1J:
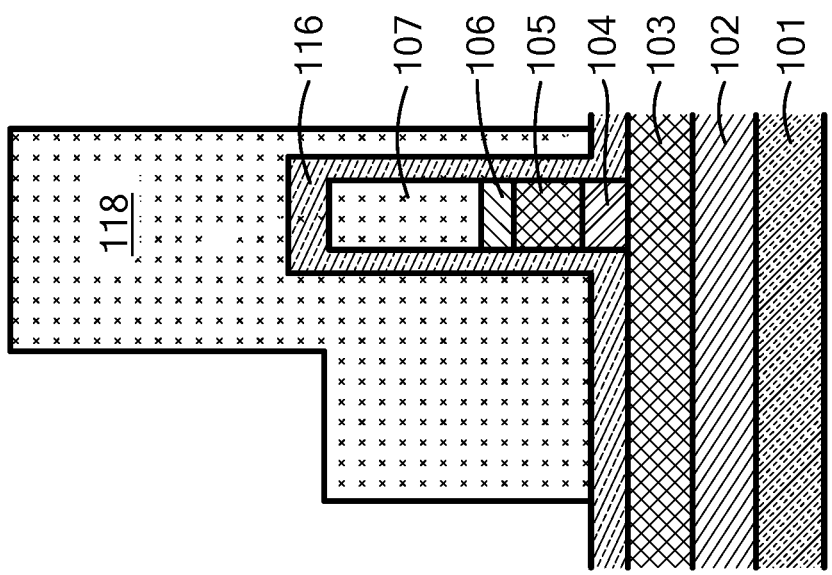
Figure 1I:
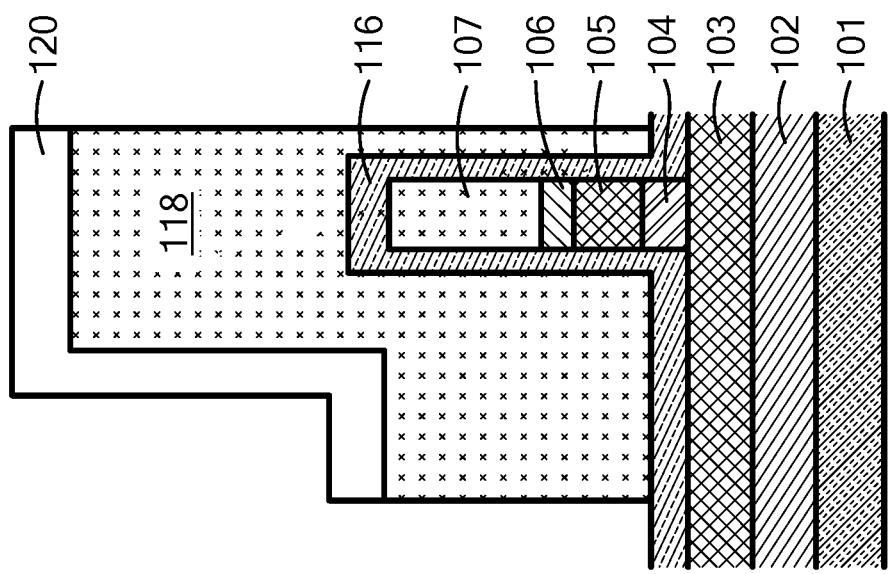

Referring to FIGS. 1I and 1J, an etching process is used to etch the exposed portions of the second hard mask, and the second photoresist is removed. For example, an etching process (e.g., reactive ion etching) is used to etch the second hard mask 118 with the photoresist 120 acting as a mask, and after the etching of the second hard mask 118, the photoresist 120 is stripped away Referring to FIG. 1K, the exposed portions of the base and the etching layer are etched. For example, the exposed portions of the layers base 100 and the etching layer 116 are etched using an ion beam etching process to form a second intermediate structure 122. In particular, layers 102, 103 are etched. During the etching, the tunnel barrier 104 remains protected by the vertical walls of 116a, 116b and second hard mask 118 from any re-deposition that might result from milling of layers 102, 103 during ion beam etching.

Figure 1L:
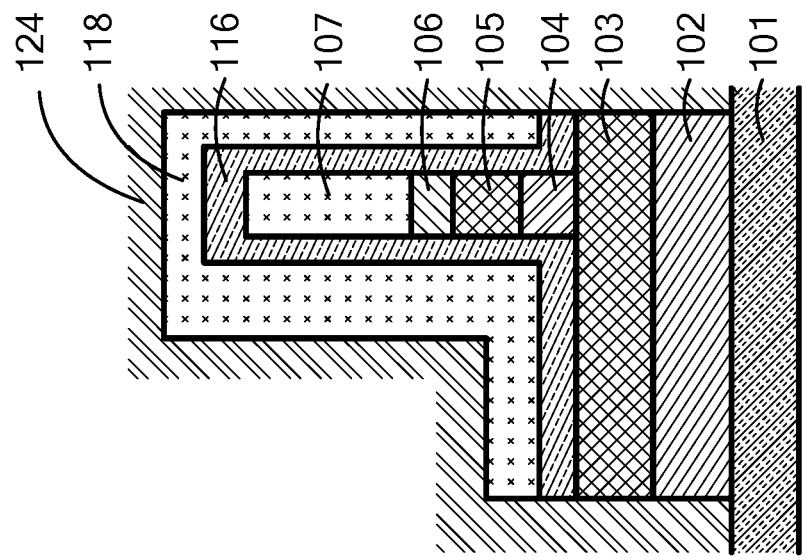

Referring to FIG. 1L, an endcap is deposited on the second intermediate structure. For example, an end cap 124 is disposed on the second intermediate structure 122. In one example, the end cap is silicon nitride.

Figure 2:
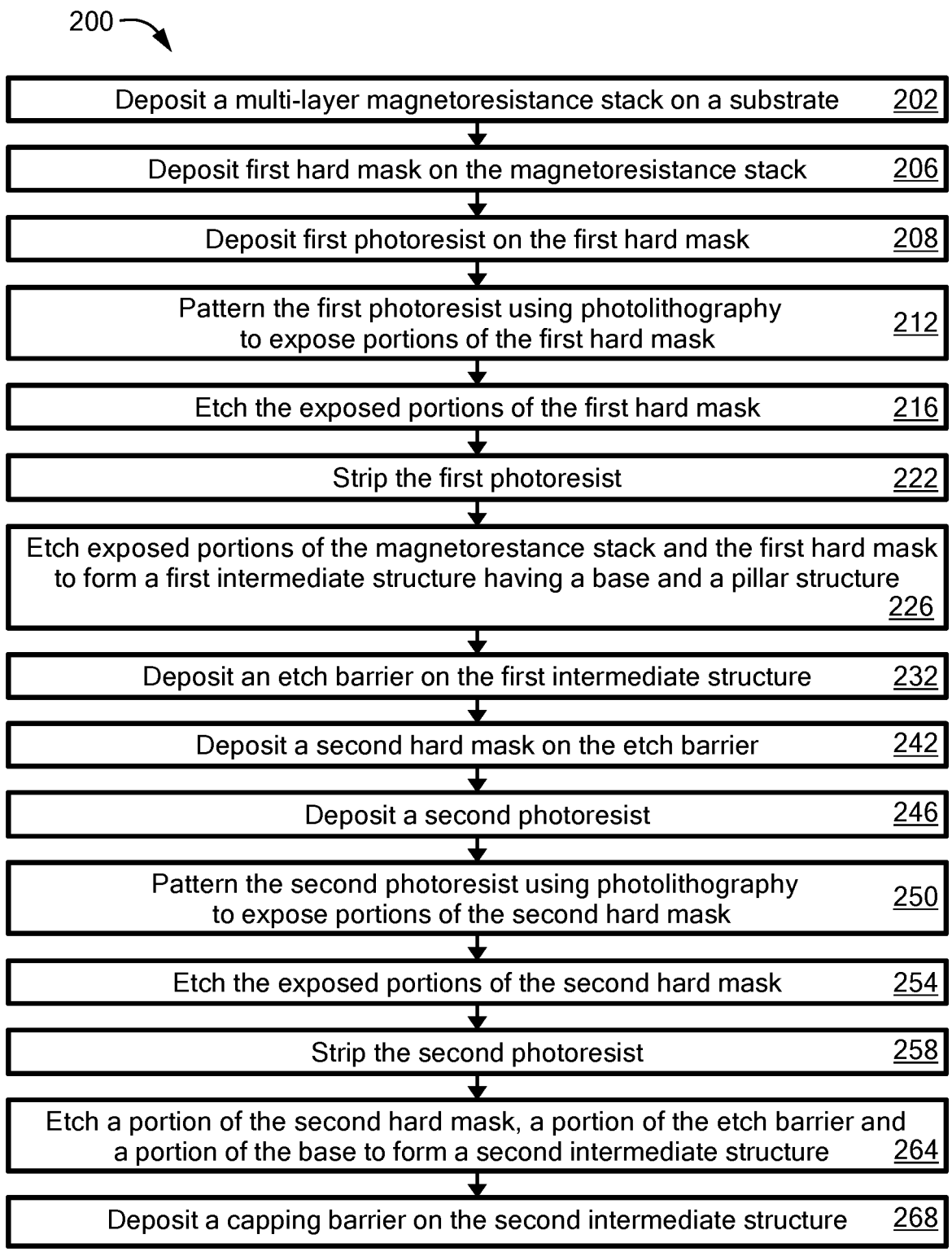
FIG. 2 is a flowchart of an example of a process to pattern the magnetoresistance stack that includes two hard masks.

Referring to FIG. 2, an example of a process to pattern a magnetoresistance stack having two hard masks is a process 200. In one example, process 200 is performed under vacuum.

Process 200 deposits a multilayer magnetoresistance stack on a substrate (202) and deposits a first hard mask on the multilayer magnetoresistance stack (206), for example as depicted in FIG. 1A.

Process 200 deposits a first photoresist on the first hard mask (208) and patterns the first photoresist using photolithography to expose portions of the first hard mask (212), for example, as depicted in FIG. 1B.

Process 200 etches the exposed portions of the first hard mask (216), for example, as depicted in FIG. 1C. Process 200 strips the first photoresist (222), for example, as depicted in FIG. 1D.

Process 200 etches the exposed portions of the magnetoresistance stack and the first hard mask to form an intermediate structure (226), for example, as depicted in FIG. 1E. Process 200 deposits an etch barrier on the intermediate structure (232), for example, as depicted in FIG. 1F.

Process 200 deposits a second hard mask on the etch barrier (242), for example, as depicted in FIG. 1G. Process 200 deposits a second photoresist (246) and patterns the second photoresist using photolithography to expose portions of the second mask (250), for example, as depicted in FIG. 1H.

Process 200 etches the exposed portions of the second hard mask (254), for example, as depicted in FIG. 1I. Process 200 strips the second photoresist (258), for example, as depicted in FIG. 1J.

Figure 1K:
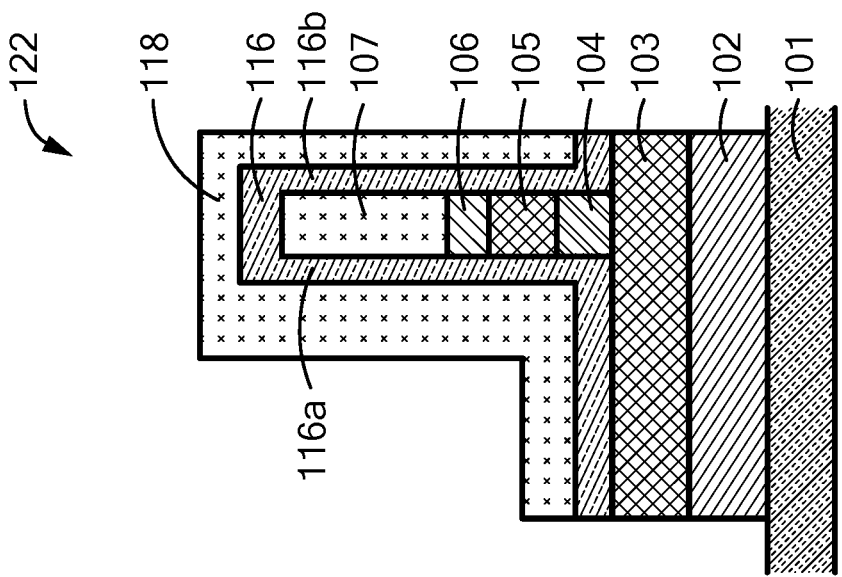

Process 200 etches a portion of the second hard mask, a portion of the etch barrier and a portion of the base to form a second intermediate structure (264), for example, as depicted in FIG. 1K. Process 200 deposits a capping layer on the second intermediate structure (268), for example, as depicted in FIG. 1L.

The processes described herein are not limited to the specific examples described. For example, the process 200 is not limited to the specific processing order of FIG. 2 respectively. Rather, any of the processing blocks of FIG. 2 may be re-ordered, combined or removed, performed in parallel or in serial, as necessary, to achieve the results set forth above. In another example, processing blocks 232 and 242 to form the sidewalls 116a, 116b may be repeated for each tunneling barrier 104 in a magnetoresistance stack.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
    depositing on a substrate a magnetoresistance stack comprising a plurality of layers comprising a first set of one or more magnetoresistance layers and a second set of one or more magnetoresistance layers;
    depositing a first hard mask on the magnetoresistance stack;
    depositing a first photoresist on the first hard mask;
    patterning the first photoresist using photolithography to expose portions of the first hard mask;
    etching the exposed portions of the first hard mask to expose a portion of the magnetoresistance stack;
    stripping the first photoresist;
    etching the exposed portions of the magnetoresistance stack and the first hard mask to form a first intermediate structure having a base and a pillar structure;
    depositing an etch barrier on the first intermediate structure;
    depositing a second hard mask on the etch barrier;
    depositing a second photoresist on the second hard mask;
    patterning the second photoresist using photolithography to expose portions of the second hard mask;
    etching the exposed portions of the second hard mask;
    stripping the second photoresist;
    etching a portion of the second hard mask, a portion of the etch barrier and a portion of the base to form a second intermediate structure; and
    depositing a capping barrier on the second intermediate structure.

2. The method of claim 1, wherein etching the exposed portions of the magnetoresistance stack and the first hard mask to form the first intermediate structure having the base and the pillar structure comprises etching the exposed portions of the magnetoresistance stack to form the first intermediate structure having the base, the base comprising:
    a conductive layer on the substrate; and
    an active element on the conductive layer.

3. The method of claim 1, wherein etching the exposed portions of the magnetoresistance stack and the first hard mask to form the first intermediate structure having the base and the pillar structure comprises etching the exposed portions of the magnetoresistance stack and the first hard mask to form the first intermediate structure having the pillar structure, the pillar structure comprising:
    the first hard mask;
    capping material;
    an active element; and
    a tunneling barrier.

4. The method of claim 1, wherein depositing on the substrate the magnetoresistance stack comprises depositing one of a tunneling magnetoresistance (TMR) stack or a magnetic tunnel junction (MTJ) stack.

5. The method of claim 1, wherein depositing the capping barrier comprises depositing a capping barrier comprising silicon nitride.

6. The method of claim 1, wherein depositing the magnetoresistance stack on the substrate comprises depositing a magnetoresistance stack comprising a layer of magnesium oxide.

7. The method of claim 1, wherein depositing the magnetoresistance stack on the substrate comprises depositing a magnetoresistance stack comprising a layer of silicon nitride.

8. The method of claim 1, wherein depositing the magnetoresistance stack on the substrate comprises depositing the magnetoresistance stack on the substrate, the substrate comprising one of silicon dioxide or silicon nitride.

9. The method of claim 1, wherein depositing the first hard mask or the second hard mask comprises depositing silicon dioxide.

10. The method of claim 1, wherein depositing an etch barrier comprises depositing an etch barrier comprising silicon nitride.

11. The method of claim 1, wherein etching the exposed portions of the magnetoresistance stack comprises etching using an ion beam etching process.

12. The method of claim 1, wherein etching the portion of the second hard mask, the portion of the etch barrier and the portion of the base comprises etching using an ion beam etching process.

13. The method of claim 1, wherein depositing on the substrate a magnetoresistance stack having a plurality of layers comprising the first set of one or more magnetoresistance layers and the second set of one or more magnetoresistance layers comprises depositing on the substrate a magnetoresistance stack having the plurality of layers comprising:
    a first set of one or more magnetoresistance layers comprising:
        one or more active elements; and
        a tunneling barrier layer;

a second set of one or more magnetoresistance layers comprising an active element.

\* \* \* \* \*